(12) United States Patent
Chuang et al.

(10) Patent No.: US 7,548,822 B2
(45) Date of Patent: Jun. 16, 2009

(54) APPARATUS AND METHOD FOR DETERMINING THE SLEW RATE OF A SIGNAL PRODUCED BY AN INTEGRATED CIRCUIT

(75) Inventors: Ching-Te K. Chuang, South Salem, NY (US); Amlan Ghosh, Salt Lake City, UT (US); Jae-Joon Kim, Austin, TX (US); Rahul M. Rao, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/777,329

(22) Filed: Jul. 13, 2007

(65) Prior Publication Data

US 2009/0018787 A1    Jan. 15, 2009

(51) Int. Cl.
*G01R 19/00* (2006.01)
(52) U.S. Cl. .................................. 702/64
(58) Field of Classification Search ............ 702/64, 702/79, 125; 327/170, 540; 375/326, 330, 375/371
See application file for complete search history.

(56) References Cited

U.S. PATENT DOCUMENTS 4,612,654 A * 9/1986 DeFreitas ................. 375/249
6,573,767 B1    6/2003 Caldwell
6,650,174 B2   11/2003 Bell
6,864,731 B2    3/2005 Zumkehr
2004/0189363 A1 * 9/2004 Takano ..................... 327/175
2005/0201491 A1 * 9/2005 Wei ........................ 375/326

FOREIGN PATENT DOCUMENTS

JP          4225177        8/1992

OTHER PUBLICATIONS

ESP, [online]; [retrieved on Jul. 12, 2007]; retrieved from the Internet http://v3.espacenet.com/textdoc?DB=EPODOC&IDX=JP4225177 &F=0; Japanese Paten Abstract; "Measuring Apparatus for Slew Rate of Semiconductor Device"; Aug. 14, 1992; 1p; JP4225177, Japan.

* cited by examiner

*Primary Examiner*—Bryan Bui
(74) *Attorney, Agent, or Firm*—Cantor Colburn LLP; Rafeal Perez-Pineiro

(57) ABSTRACT

Determining a slew rate of a signal from an integrated circuit under test by comparing the signal with a first reference voltage, comparing the signal with a second reference voltage different from the first reference voltage, generating an output pulse having a pulse width indicative of a slew rate of the signal, and integrating the output pulse over time to generate an output voltage proportional to the pulse width; wherein the output voltage is indicative of the slew rate of the signal produced by the integrated circuit.

7 Claims, 4 Drawing Sheets

APPARATUS AND METHOD FOR DETERMINING THE SLEW RATE OF A SIGNAL PRODUCED BY AN INTEGRATED CIRCUIT

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to semiconductor devices and, more particularly, to techniques for determining the slew rate of a signal produced by an integrated circuit.

2. Description of Background

Slew rate represents the maximum rate of change of signal at any point in an electronic circuit. Limitations in the slew rate capability of an integrated circuit may give rise to undesirable non-linear effects. For example, in order for a sinusoidal waveform not to be subject to slew rate limitations, the slew rate capability at all points in an amplifier or other circuit must exceed $2\pi f V_{pk}$, where f is the frequency, and $V_{pk}$ is the peak value of the waveform. Slew rate is generally expressed in units of Volts per microseconds (µs). The output slew rate of an amplifier or other electronic circuit is defined as the maximum rate of change of the output voltage for all possible input signals.

$$SR = \max\left(\left|\frac{dv_{out}(t)}{dt}\right|\right)$$

where $v_{out}(t)$ is the output produced by the amplifier as a function of time t. As a practical matter, the slew rate of an amplifier may be measured using a square wave generator and an oscilloscope.

For purposes of illustration, an integrated circuit may utilize an input stage in the form of a differential amplifier having a transconductance characteristic. Transconductance refers to the input stage accepting a differential input voltage and, in response thereto, generating an output current in an additional stage. The transconductance of many integrated circuits is designed to be quite high, so as to provide a large amount of open loop gain. This high current gain means that a fairly small input voltage can cause the input stage to saturate, thereby producing a nearly constant output current. The additional stage of the integrated circuit may be utilized to implement a frequency compensation function. More specifically, the additional stage may have a low pass characteristic approximating an integrator. A constant current input will therefore produce a linearly increasing output. If the additional stage has a compensation capacitance C and gain $A_2$, then slew rate in this example can be expressed as:

$$SR = \frac{I_{sat}}{CA_2}$$

where $I_{sat}$ is the output current of the first stage in saturation.

In the case of complementary metal-oxide semiconductor (CMOS) integrated circuits, slew rate detection may be employed to provide an indication of short-circuit current flowing through a sink gate. If the slew rate is large, this signifies that a set of voltage pull-up semiconductor devices in the integrated circuit and a set of voltage pull-down semiconductor devices in the integrated circuit are partially on for the duration that a signal is greater than the threshold voltage (VTN) of an N-type field effect transistor (NFET), but less than the supply voltage (Vdd) minus the threshold voltage (VTP) of a P-type field effect transistor (PFET), thereby providing a low-resistance path between the supply voltage and ground. On the other hand, if the slew rate is small, this indicates that a signal may be susceptible to extraneous noise and coupling effects in the integrated circuit.

In the case of integrated circuits such as microprocessors, variations in process parameters and on-chip environmental conditions may cause the delay and leakage current of the microprocessor to vary significantly from a set of desired design values. Due to mismatches between two different types of semiconductor devices commonly used in the microprocessor, namely n-type metal-oxide semiconductor (NMOS) devices and p-type metal-oxide semiconductor (PMOS) devices, the microprocessor may operate at the intended design frequency but exhibit excessive leakage current. This observed phenomenon is attributable to the fact that some types of semiconductor devices are much faster (and much more leaky) than required, while other types of semiconductor devices are slower than required but only marginally less leaky than the faster devices. Thus, the delay impact of a performance variation may be minimal, whereas the power impact of a performance variation may be significant. Similarly, other microprocessors may fail to meet the target frequency but show nominal leakage power. Thus, it has become necessary to develop slew rate detectors that can detect mismatches between two different types of semiconductor devices. With the availability of such information, it is then possible to compensate for these mismatches and thus improve the yield of a given microprocessor design.

A few techniques have been proposed in recent years to detect the slew rate of an integrated circuit. For example, an inverter configuration may be employed which uses a fixed input bias of one-half the supply voltage. The deviation of the output voltage from the intended design point is then a representation of slew rate and device mismatch within the integrated circuit. However, this technique is only effective for characterizing a mismatch at one point on the current-voltage (I-V) curve for the device. Another technique utilizes multiple ring oscillators to detect the impact of semiconductor device mismatches on slew rate. These ring oscillators consume a significant amount of space and require the user to perform a manual calculation of device mismatch parameters, thus rendering this approach unsuitable for providing automatic mismatch compensation. In view of the foregoing shortcomings, what is needed is an improved technique for detecting the slew rate of an integrated circuit. Such a technique should enable detection of device mismatches and automatically generate an output signal that can be used for the purpose of providing mismatch compensation.

SUMMARY OF THE INVENTION

The shortcomings of the prior art are overcome and additional advantages are provided by methods and apparatuses for determining a slew rate of a signal produced by an integrated circuit under test. These apparatuses include a first comparator for comparing the signal with a first reference voltage, a second comparator for comparing the signal with a second reference voltage different from the first reference voltage, an exclusive OR (XOR) gate operatively coupled to the first and second comparators for generating an output pulse having a pulse width indicative of a slew rate of the signal, and an integrator for integrating the output pulse over time to generate an output voltage proportional to the pulse width; wherein the output voltage is indicative of the slew rate of the signal produced by the integrated circuit.

Methods for determining a slew rate of a signal produced by an integrated circuit under test comprise: comparing the signal with a first reference voltage, comparing the signal with a second reference voltage different from the first reference voltage, generating an output pulse having a pulse width indicative of a slew rate of the signal, and integrating the output pulse over time to generate an output voltage proportional to the pulse width; wherein the output voltage is indicative of the slew rate of the signal produced by the integrated circuit.

TECHNICAL EFFECTS

As a result of the summarized invention, technically we have achieved a solution wherein an output pulse is generated having a pulse width proportional to the slew rate of a signal produced by an integrated circuit. This solution may be used to determine rising slews, falling slews, or both.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
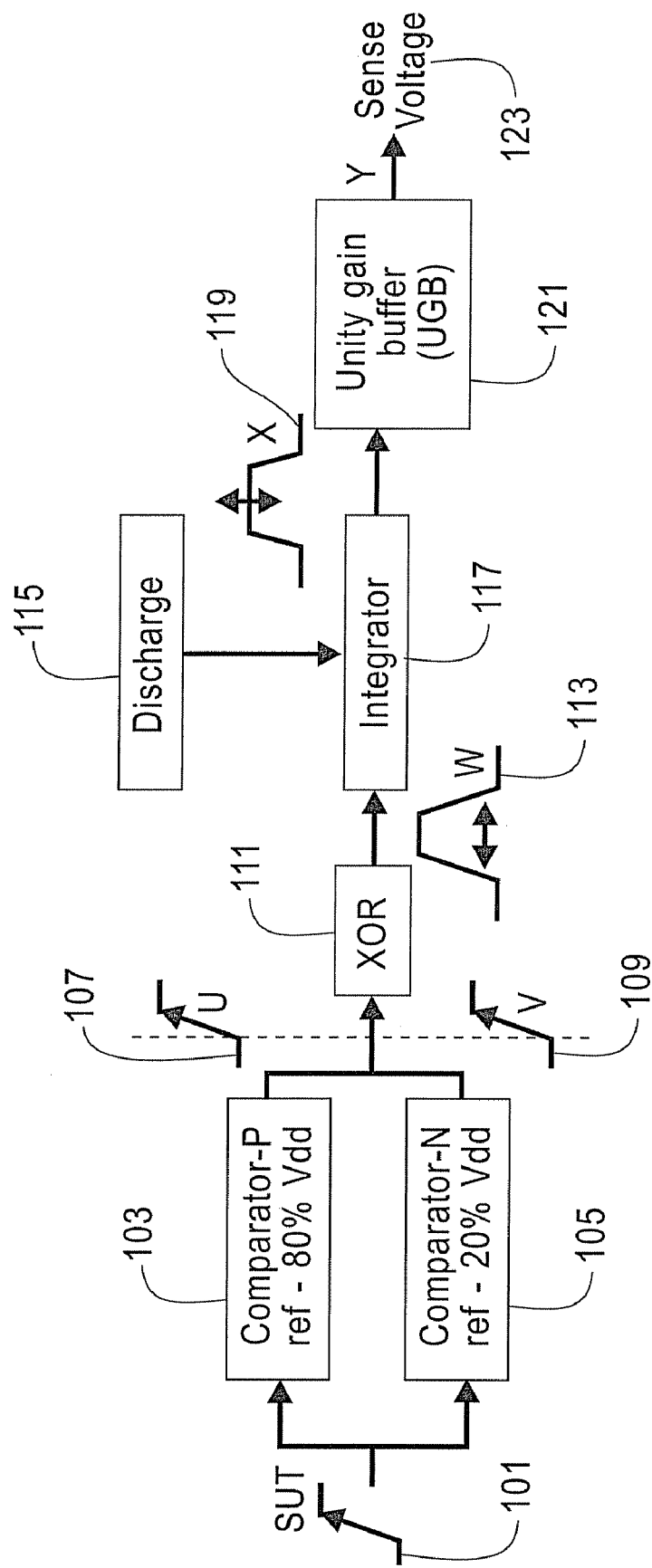
FIG. 1 illustrates one example of a slew rate monitor for detecting the slew rate of a signal produced by an integrated circuit.

FIG. 1 illustrates one example of a slew rate monitor for detecting the slew rate of a signal produced by an integrated circuit. This slew rate monitor may be employed, for example, to estimate the extent of a mismatch between a first type of semiconductor device and a second type of semiconductor device used in the integrated circuit. A signal under test (SUT) 101, representing a signal produced by an integrated circuit under test, is connected to two comparators, a comparator-N 105 and a comparator-P 103. Comparator-N 105 is an NMOS comparator comprised of thick-oxide long channel NMOS devices and capable of comparing SUT 101 with a first reference voltage less than a second reference voltage. Illustratively, this first reference voltage could, but need not, be substantially equal to 20% of a supply voltage being supplied to the integrated circuit under test. Similarly, Comparator-P 103 is a PMOS comparator comprised of thick-oxide long channel PMOS devices and capable of comparing SUT 101 with the second reference voltage. Illustratively, this second reference voltage could, but need not, be substantially equal to 80% of the supply voltage being supplied to the integrated circuit under test. The first and second reference voltages each represent any value within a range of amplitudes defined by the input signal. The first and second voltages could, but need not, add up to the supply voltage.

Use of a first reference voltage substantially equal to 20% of supply voltage and a second reference voltage substantially equal to 80% of the supply voltage is advantageous in that good resolution may be obtained for a sense voltage 123 produced by the slew rate monitor of FIG. 1, along with a wider range of voltages for sense voltage 123. Moreover, these values for first and second reference voltages are used to provide a sufficient noise margin against any power supply noise appealing on SUT 101. However, the slew rate monitor of FIG. 1 could alternatively or additionally be configured for a first reference voltage substantially equal to 10% of supply voltage with a second reference voltage substantially equal to 90% of supply voltage, or alternatively or additionally configured for any set of first and second reference voltages, the sum of which total to substantially 100% of supply voltage.

The first and second reference voltages are used to characterize a rise slew for SUT 101. In accordance with the foregoing examples, rise slew of SUT 101 is defined as time taken for the signal to rise from 20% of the supply voltage to 80% of the supply voltage, or from 10% of the supply voltage to 90% of the supply voltage. Similarly, a fall slew of the signal is defined as time taken for the signal to fall from 80% of the supply voltage to 20% of the supply voltage, or from 90% of the supply voltage to 10% of the supply voltage.

The output of one comparator switches before the output of the other comparator, depending upon the slew of SUT 101 and the direction of transition. For example, an output U 107 of comparator-P 103 may switch before an output V 109 of comparator-N 105 switches, or the output V 109 of comparator-N 105 may switch before the output U 107 of comparator-P 103 switches. Outputs U 107 and V 109 are fed to an input of an exclusive-OR (XOR) 111 gate. XOR 111 gate generates an output in the form of a pulse 113 having a pulse width W. Pulse width W is indicative of the slew rate of SUT 101.

Pulse 113 is integrated over time by an integrator 117 to generate an output voltage 119 proportional to pulse width W. Integrator 117 thus functions as a time-to-voltage converter. Therefore, output voltage 119 is proportional to the slew rate of SUT 101. Discharge circuit 115, operably coupled to integrator 117, acts as a reset mechanism. This reset mechanism enables output voltage 119 of integrator 117 to be reset to zero before a new SUT 101 is applied to the slew rate monitor of FIG. 1. Output voltage 119 is fed to a very low output offset unity gain buffer 121, the output of which is represented as sense voltage 123 indicative of the extent of semiconductor device mismatch in the integrated circuit under test. Illustratively, one or more of the elements shown in FIG. 1 may be fabricated using thick oxide semiconductor devices.

Figure 2:
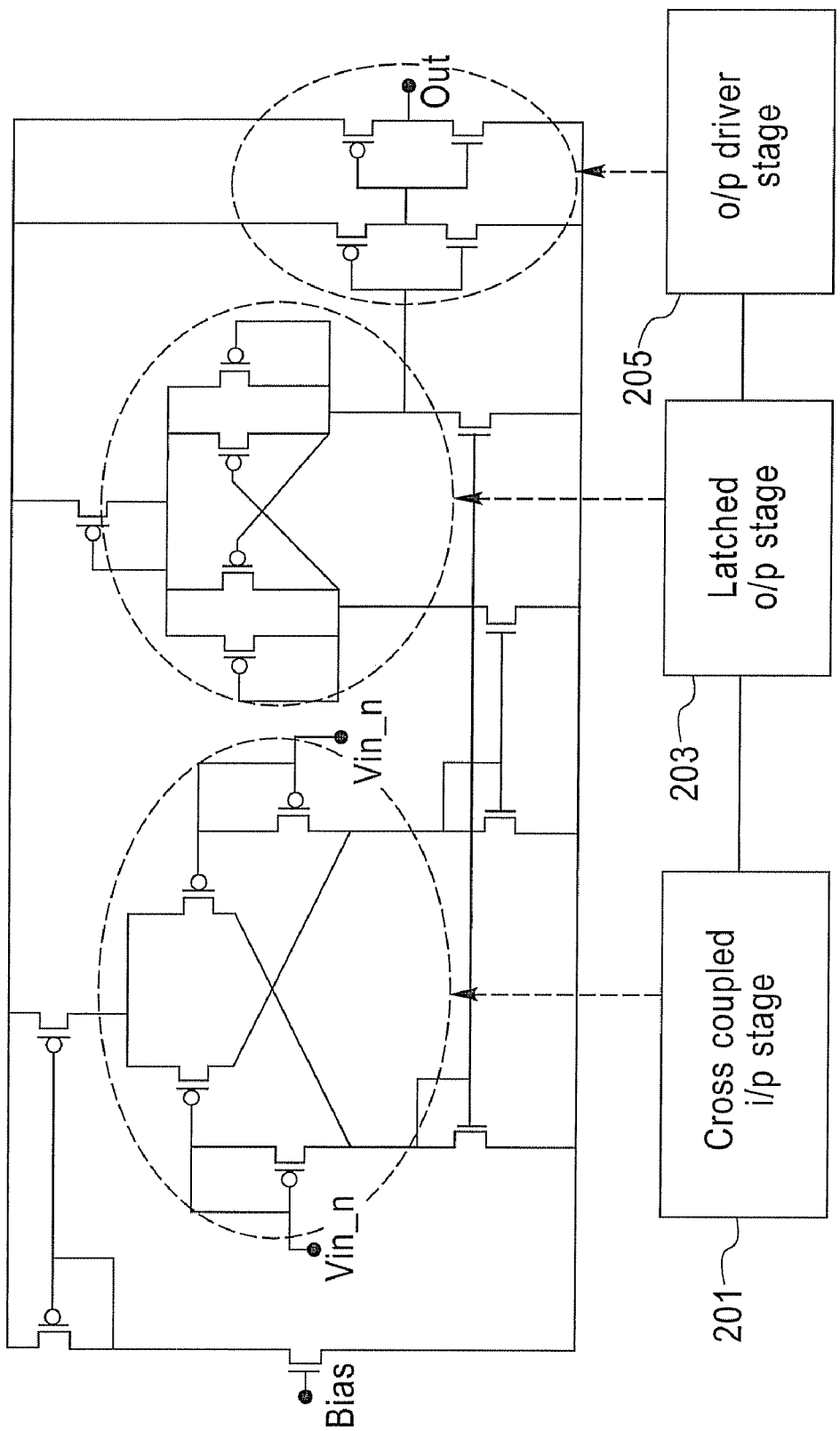
FIG. 2 illustrates one example of a PMOS comparator for use with the slew rate monitor of FIG. 1.

Comparator-P 103 may be implemented using a PMOS high speed comparator that exhibits high transconductance gain $G_M$. Similarly, comparator-N 105 may be implemented using an NMOS high speed comparator that exhibits high transconductance gain $G_M$. FIG. 2 illustrates one example of a PMOS comparator for use with the slew rate monitor of FIG. 1 to implement comparator-P 103. Note that comparator-N 105 could be implemented with an identical architecture as used for comparator-P 103, with the exception that the PMOS devices of comparator-P 103 would be replaced with NMOS devices for comparator-N 105.

The PMOS comparator of FIG. 2 includes a cross-coupled input (i/p) stage 201 providing high transconductance gain $G_M$ for the purpose of achieving faster output response. Input stage 201 functions as a preamplifier with a very high bandwidth for providing an amplified signal with minimal delay to a latched output (o/p) stage 203. Latched output stage 203 is providing a positive feedback to achieve a high positive exponential response at its output. Thus, the combination of input stage 201 and latched output stage 203 provides a minimum delay output with a fast slew rate. Latched output stage 203 drives an output (o/p) driver stage 205. Output driver stage 205 may be implemented using a suitably sized inverter based buffer with an output drive current capacity determined in accordance with specified load parameters for the PMOS comparator. For example, the P comparator may be designed to provide an output slew of 30 picoseconds (ps) and an output delay of 2 nanoseconds (ns) for an SUT 101 (FIG. 1) slew of 25 ps.

Integrator 117 (FIG. 1) may be implemented using a simple current mirror based linear integrator having a discharge path connected to a first capacitor designated as an output capacitor. A second capacitor, designated as a decoupling capacitor, is used as an integrating capacitor. The integrating time constant is dependent upon the value of the integrating capacitor and the integrating current of integrator 117 and, hence, can be tuned as required, depending upon the pulse width W of pulse 113.

Figure 3:
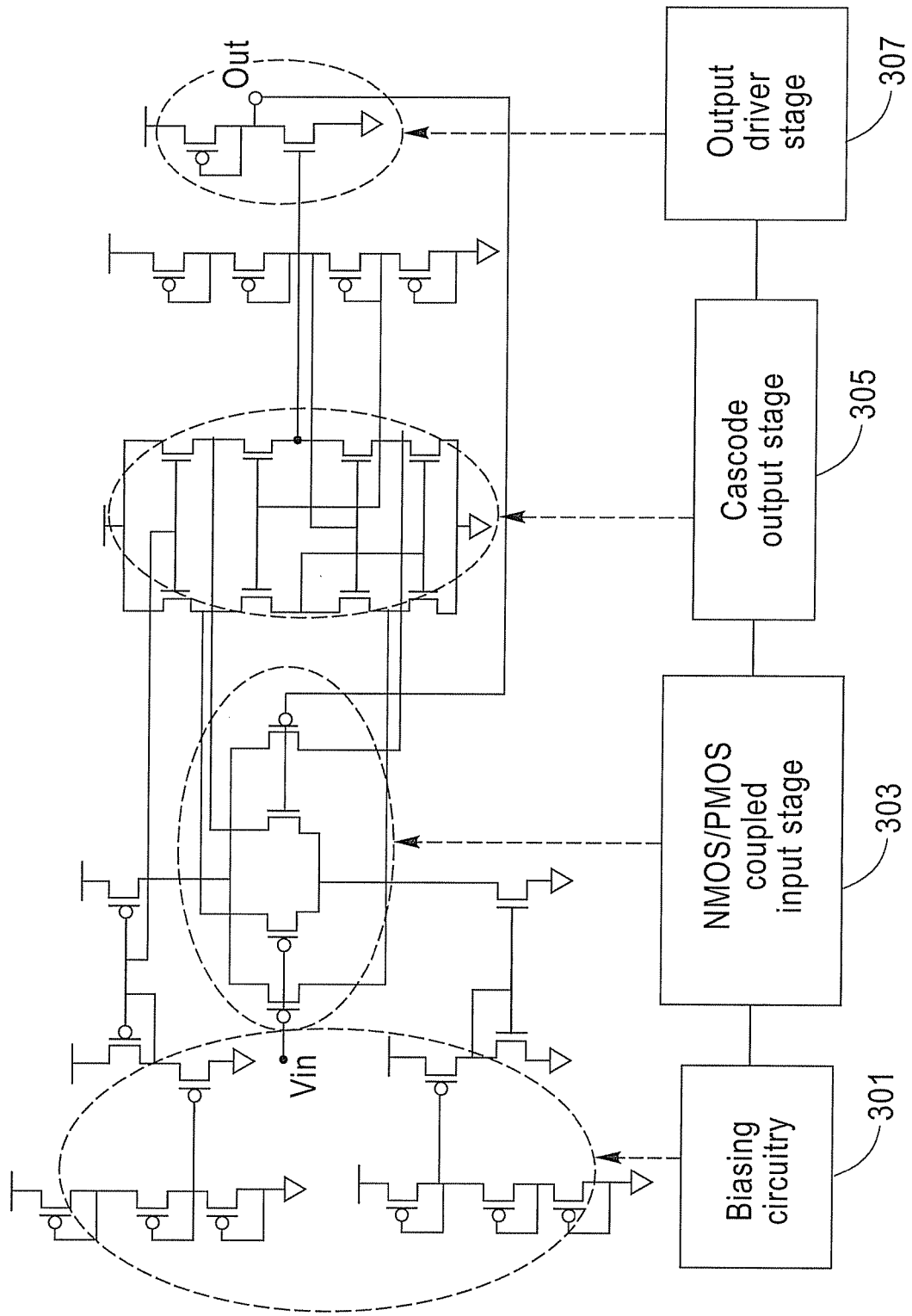
FIG. 3 illustrates one example of a unity gain buffer for use with the slew rate monitor of FIG. 1.

FIG. 3 illustrates one example of a suitable architecture for implementing unity gain buffer 121 of FIG. 1. As shown in FIG. 3, the unity gain buffer may be implemented using a rail-to-rail input stage operational amplifier (OPAMP) in the unity-gain-buffer mode to provide a rail-to-rail output dynamic range. Biasing circuitry 301 is employed to bias an NMOS/PMOS coupled input stage 303. NMOS/PMOS coupled input stage 303 may represent an N-channel and a P-channel differential input stage coupled in parallel to achieve an extended input common mode range (ICMR) of supply voltage. The desired high output gain is achieved using a cascode output stage 305 which drives an output driver stage 307. The negative input terminal of NMOS/PMOS coupled input stage 303 is coupled to the output of output driver stage 307 to operate the OPAMP as a unity gain buffer. This OPAMP exhibits a very low output offset voltage on the order of 1-2 millivolts (mV).

Figure 4:
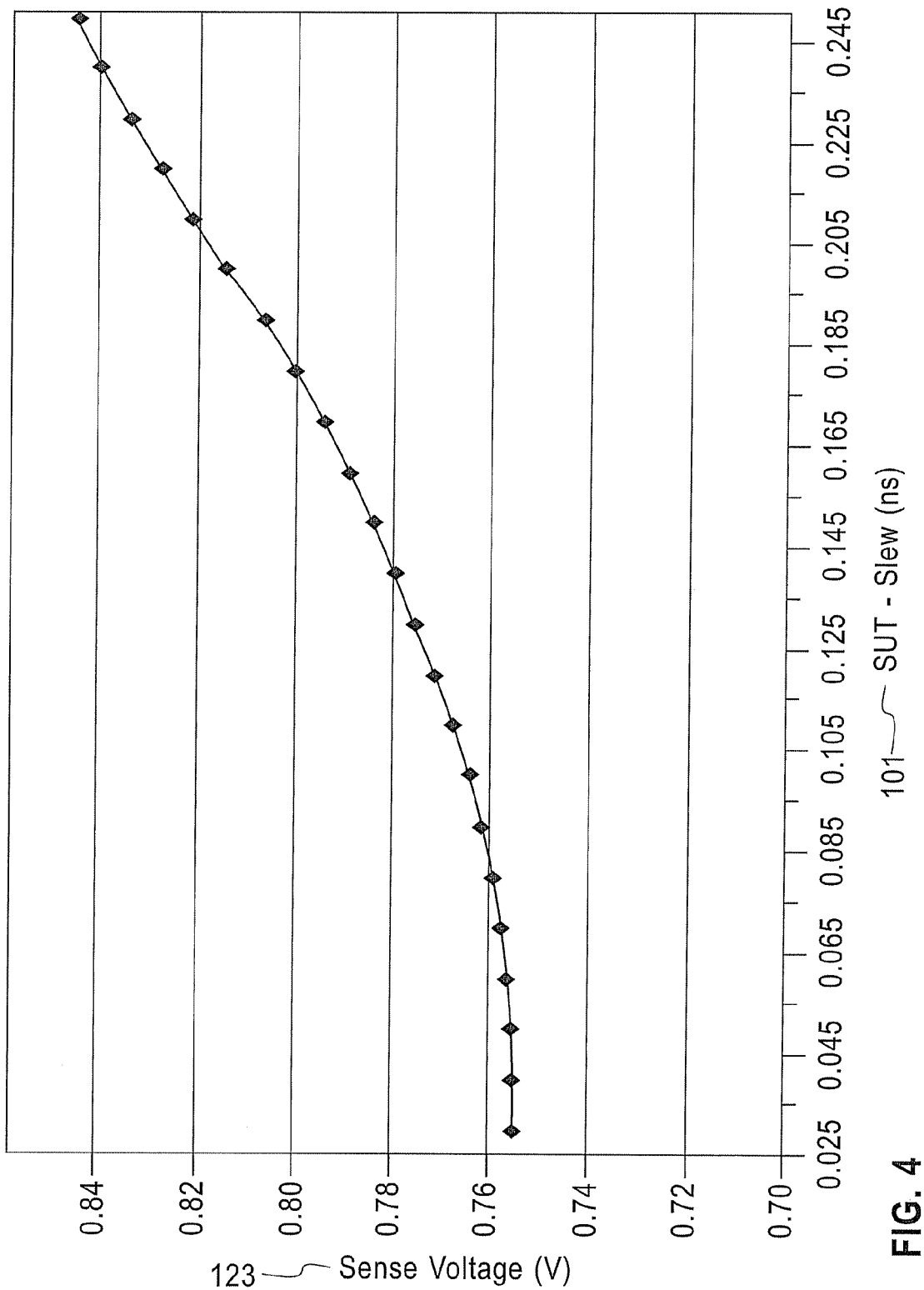
FIG. 4 is a plot showing the relationship between sense voltage and slew for the slew rate monitor of FIG. 1.

FIG. 4 is a plot showing the relationship between sense voltage 123 (FIG. 1) and input slew of SUT 101 for the slew rate monitor of FIG. 1. To prepare the plot of FIG. 4, the input slew, representing signal SUT 101 (FIG. 1) produced by an integrated circuit under test, is varied from 25 ps to 250 ps and the output of unity gain buffer 121 is then plotted. Upon analyzing the plot of FIG. 4, it is apparent that the slew rate monitor of FIG. 1 exhibits an output sensitivity of 0.5 mV per ps.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An apparatus for determining a slew rate of a signal produced by an integrated circuit under test, the apparatus comprising:
   a first comparator for comparing the signal with a first reference voltage,
   a second comparator for comparing the signal with a second reference voltage different from the first reference voltage,
   an exclusive OR (XOR) gate operatively coupled to the first and second comparators for generating an output pulse having a pulse width indicative of a slew rate of the signal;
   an integrator for integrating the output pulse over time to generate an output voltage proportional to the pulse width;
   wherein the output voltage is indicative of the slew rate of the signal produced by the integrated circuit.

2. The apparatus of claim 1 wherein the first reference voltage is substantially equal to 20% of a supply voltage being supplied to the integrated circuit under test.

3. The apparatus of claim 1 wherein the second reference voltage is substantially equal to 80% of a supply voltage being supplied to the integrated circuit under test.

4. The apparatus of claim 1 wherein the first and second comparators are fabricated using thick oxide semiconductor devices.

5. The apparatus of claim 1, wherein the first and second comparators further comprise:
   a cross-coupled input stage;
   a latched output stage providing positive feedback to the input stage; and
   an output driver stage driven by the latched output stage.

6. The apparatus of claim 5, wherein:
   the cross-coupled input stage and the latched output stage of the first comparator comprise PMOS devices; and
   the cross-coupled input stage and the latched output stage of the second comparator comprise NMOS devices.

7. The apparatus of claim 6, wherein the output driver stage comprises an inverter based buffer.

* * * * *